US008338711B2

(12) United States Patent
Jung et al.

(10) Patent No.: US 8,338,711 B2
(45) Date of Patent: Dec. 25, 2012

(54) DISPLAY DEVICE AND MANUFACTURING METHOD THEREOF

(75) Inventors: Daesung Jung, Seoul (KR); Jonghyuck Lee, Kyungbuk (KR); Heesung Woo, Daegu (KR); Jungeun Son, Seoul (KR)

(73) Assignee: LG Display Co., Ltd., Seoul (KR)

( * ) Notice: Subject to any disclaimer, the term of this patent is extended or adjusted under 35 U.S.C. 154(b) by 255 days.

(21) Appl. No.: 12/853,604

(22) Filed: Aug. 10, 2010

(65) Prior Publication Data
US 2011/0036612 A1    Feb. 17, 2011

(30) Foreign Application Priority Data

Aug. 13, 2009   (KR) .................. 10-2009-0074859

(51) Int. Cl.
*H05K 1/02*    (2006.01)
(52) U.S. Cl. ........ 174/250; 345/156; 349/110; 257/288; 361/679.21
(58) Field of Classification Search .................. 345/173, 345/98, 55, 87, 156, 169, 473, 211, 204, 345/176; 349/50, 65, 15, 106, 153, 110; 359/265, 269; 174/50.5, 126.1, 126.2, 254, 174/260; 257/43, 225, 52, 59, 288; 361/679.01, 361/679.22, 679.06, 679.21, 679.26, 679.02, 361/679.05, 679.46, 796, 751, 707, 749, 361/829
See application file for complete search history.

(56) References Cited

U.S. PATENT DOCUMENTS

| 5,978,060 A * | 11/1999 | Nakawaki et al. ............ 349/150 |
| 7,495,738 B2 * | 2/2009 | Okuda .......................... 349/150 |
| 7,907,233 B2 * | 3/2011 | Kang et al. ...................... 349/60 |
| 2007/0019275 A1 * | 1/2007 | Okuda .......................... 359/265 |

FOREIGN PATENT DOCUMENTS

| CN | 1161519 A | 10/1997 |
| CN | 1319826 A | 10/2001 |
| CN | 1464989 A | 12/2003 |
| CN | 1512561 A | 7/2004 |

OTHER PUBLICATIONS

Chinese Office Action (Application No. 201010251460.3), dated Jul. 3, 2012, with English translation.

* cited by examiner

*Primary Examiner* — Hung Duong
(74) *Attorney, Agent, or Firm* — Morgan, Lewis & Bockius LLP

(57) ABSTRACT

Provided is a display panel comprising a first panel comprising a first lower substrate and a first upper substrate; a first alignment key formed in the first lower substrate; a second alignment key formed in the first upper substrate, the second alignment key is disposed in a position corresponding to the first alignment key; a second panel attached to the first panel; and a third alignment key formed in the second panel, the third alignment key is disposed in a position corresponding to the first and the second alignment keys and formed such that the first and the second alignment keys are identified.

20 Claims, 5 Drawing Sheets

DISPLAY DEVICE AND MANUFACTURING METHOD THEREOF

This application claims the benefit of Korean Patent Application No. 10-2009-0074859 filed on Aug. 13, 2009, which is hereby incorporated by reference.

BACKGROUND

1. Field

This document relates to a display device and a manufacturing method thereof.

2. Related Art

With the development of multimedia, flat panel displays become important. Accordingly, a variety of flat panel displays such as liquid crystal displays, plasma display devices, organic light emitting displays, and the like are put to practical use. Among these display devices, the liquid crystal displays and the organic light emitting displays, for example, are manufactured in such a manner that elements and interconnecting lines are formed in the form of a thin film on a substrate through a deposition method, an etching method, etc.

In recent years, a method of attaching two panels to construct a flat panel display so as to use the flat panel display as a both-sided display or a 3-dimensional (3D) display have been studied. Here, the two-sided display can display images on both sides of a display panel such that users can view the images displayed on the two sides of the display. The 3D display can display 3D images on a display panel, and thus users can view the 3D images according to control of the two panels.

A process of aligning two panels and attaching the aligned panels to each other is required to manufacture display devices for various purposes. Alignment marks formed in bezel regions of the panels are used as an identifier for accurately aligning the two panels with each other during the attaching process. The attaching process involves a process of attaching two substrates constructing each panel, and thus countless alignment keys are needed for the attaching process. However, since a panel has been designed such that the bezel region of the panel is reduced in recent years, it is required to seek ways to decrease the number of alignment keys to efficiently attach panels to each other.

SUMMARY

An aspect of this document is to provide a display device comprising: a first panel comprising a first lower substrate and a first upper substrate; a first alignment key formed in the first lower substrate; a second alignment key formed in the first upper substrate, the second alignment key is disposed in a position corresponding to the first alignment key; a second panel attached to the first panel; and a third alignment key formed in the second panel, the third alignment key is disposed in a position corresponding to the first and the second alignment keys and formed such that the first and the second alignment keys are identified.

In an aspect, a method of manufacturing a display device comprises: forming a first alignment key formed in the first lower substrate; forming a second alignment key formed in the first upper substrate, which is disposed in a position corresponding to the first alignment key; aligning the first lower substrate and the first upper substrate using the first alignment key and the second alignment key. attaching the first lower substrate and the first upper substrate to form a first panel; forming a second panel; forming a third alignment key formed in the second panel, which is disposed in a position corresponding to the first and the second alignment keys and formed such that the first and the second alignment keys are identified; aligning the first panel and the second panel using the first, the second and the third alignment key; and attaching the first panel and the second panel.

BRIEF DESCRIPTION OF THE DRAWINGS

The implementation of this document will be described in detail with reference to the following drawings in which like numerals refer to like elements.

DETAILED DESCRIPTION

Figure 1:
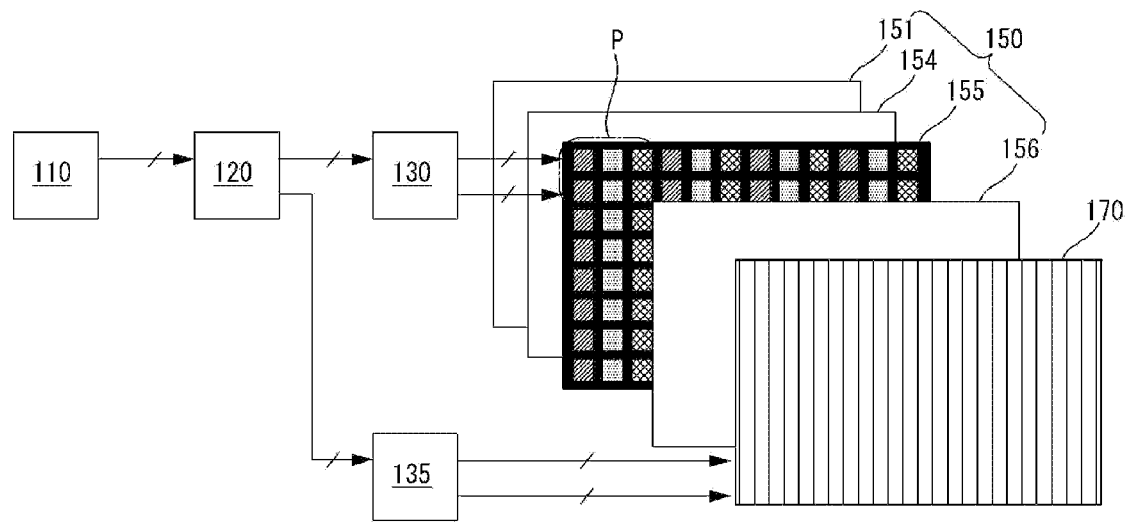
FIG. 1 is a schematic diagram of an autostereoscopic display device.
Figure 2:
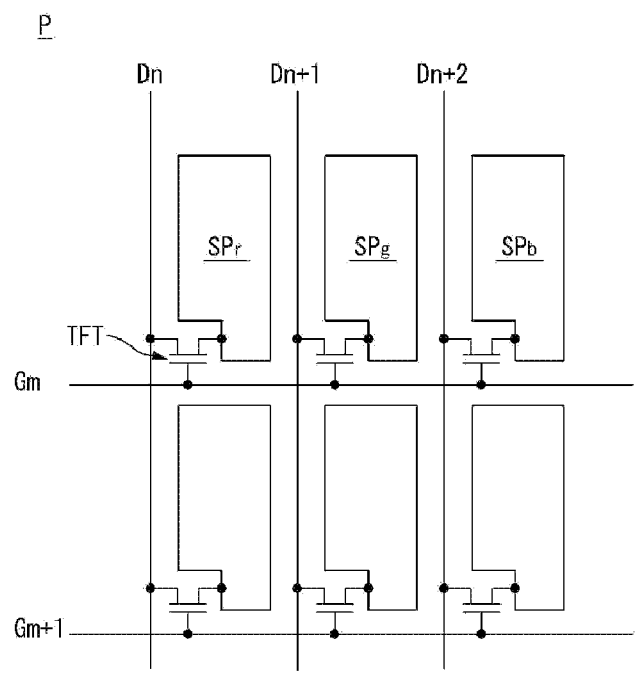
FIG. 2 illustrates sub-pixels of the display device shown in FIG. 1.
Figure 3:
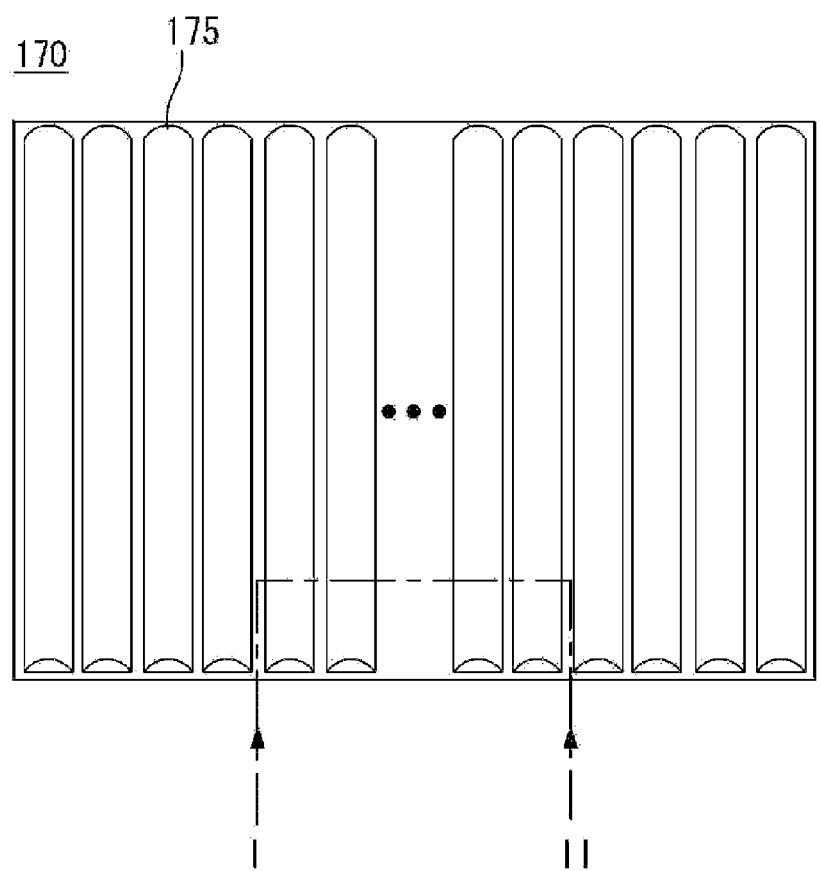
FIGS. 3 and 4 are views for explaining a lens shape of a second panel shown in FIG. 1.
Figure 4:
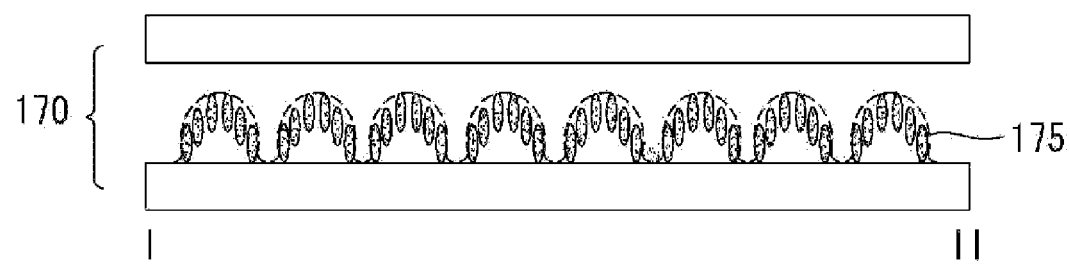

Hereinafter, an implementation of this document will be described in detail with reference to the attached drawings.

Referring to FIGS. 1, 2, 3 and 4, an autostereoscopic display device comprises an image providing unit 110, a controller 120, a first driver 130, a second driver 135, a first panel 150, and a second panel 170.

The image providing unit 110 provides video data in a 2-dimensional (2D) format to the controller 120 in a 2D mode and supplies right-eye/left-eye video data in a 3D format to the controller 120 in a 3D mode. The image providing unit 110 provides timing signals comprising a vertical synchronization signal, a horizontal synchronization signal, a data enable signal, a main clock signal and a low voltage to the controller 120. Furthermore, the image providing unit 110 selects the 2D mode or the 3D mode according to user's selection input through a user interface. The user interface comprises user input units including an on-screen display (OSD), a remote controller, a keyboard, a mouse, and the like. The image providing unit 110 may separate right-eye video data and left-eye video data from each other and encode the right-eye video data and left-eye video data according to right-eye and left-eye images displayed on the first panel 150.

The controller 120 provides the video data input from the image providing unit 110 to the first driver 130. The controller 120 may multiply the frame frequency of the input video data by n(n is a positive integer equal to or greater than 2) to increase a timing control signal frequency for controlling operating timings of the first and second drivers 130 and 135. Furthermore, the controller 120 controls electrodes formed on the second panel 170 according to the image displayed on the first panel 150 so as to control the second driver 135 to drive a liquid crystal layer 175 such that liquid crystal of the liquid crystal layer 175 tilts in the form of a lens.

The first driver 130 comprises a data driving circuit connected to data lines Dn, Dn+1, Dn+2 and a gate driving circuit connected to gate lines Gm and Gm+1. The data driving circuit converts digital video data input from the controller 120 into positive/negative analog data voltages and provides the positive/negative analog data voltages to the data lines Dn, Dn+1 and Dn+2 under the control of the controller 120. The gate driving circuit sequentially provides gate pulses (or scan pulses) to the gate lines Gm and Gm+1 under the control of the controller 120.

The second driver 135 controls the electrodes formed on the second panel 170 according to the image displayed on the first panel 150 to drive the liquid crystal layer 175 such that the liquid crystal of the liquid crystal layer 175 tilts in the form of a lens. The second driver 135 may be implemented as a shift register and a level shifter for shifting the output of the shift register to voltages Voff and +Von/−Von. Otherwise, the second driver 135 may be implemented as any analog/digital circuit capable of sequentially providing the voltages Voff and +Von/−Von to the electrodes of the second panel 170.

The first panel 150 is a display panel that displays an image according to data voltages and gate pulses provided by the first driver 130. While the first panel 150 may be implemented as a flat panel display such as a liquid crystal display (LCD) or an organic light emitting display (OLED), the LCD is described as an example in this document. The first panel 150 comprises a first lower substrate on which thin film transistors (TFTs) are formed and a first upper substrate on which a black matrix and a color filter are formed. The first lower substrate comprises the data lines Dn, Dn+1 and Dn+2, the gate lines Gm and Gm+1 intersecting the data lines Dn, Dn+1 and Dn+2, and sub-pixels SPr, SPg and SPb defined by the data lines Dn, Dn+1 and Dn+2 and the gate lines Gm and Gm+1 and arranged in a matrix form. The TFTs are respectively formed at the intersections of the data lines Dn, Dn+1 and Dn+2 and the gate lines Gm and Gm+1 and transfer data voltages supplied through the data lines Dn, Dn+1 and Dn+2 to pixel electrodes of liquid crystal cells in response to a scan pulse supplied from the gate lines Gm. To achieve this, gate electrodes of the TFTs are respectively connected to corresponding gate lines, source electrodes thereof are respectively connected to corresponding data lines, and drain electrodes thereof are respectively connected to the pixel electrodes of the liquid cells. A common electrode disposed opposite to the pixel electrodes is provided with a common voltage. The first upper substrate comprises the black matrix and the color filter formed thereon. The common electrode is formed on the first upper substrate in a vertical field driving mode such as a twisted nematic (TN) mode and a vertical alignment (VA) mode and formed together with the pixels electrodes on the first lower substrate in a horizontal field driving mode such as an in-plane switching (IPS) mode and a fringe field switching (FFS) mode. Polarizers 154 and 156 are respectively attached to the first lower substrate and the first upper substrate of the first panel 150 and an alignment film for setting a pre-tilt angle of the liquid crystal is formed thereon. Spacers for maintaining a cell gap of the liquid crystal layer 175 are formed between the first lower substrate and the first upper substrate of the first panel 150. The first panel can have any liquid crystal mode in addition to the above-described TN mode, VA mode, IPS mode and FFS mode. Furthermore, the first panel 150 can be implemented as a transmissive LCD, a semi-transmissive LCD, a reflective LCD and the like. The transmissive LCD and the semi-transmissive LCD require a back light unit 151, as shown in FIG. 1. The first panel 150 projects linearly polarized light or circularly polarized light.

The second panel 170 is a control panel that controls the image displayed on the first panel 150 and displays the controlled image. The second panel 170 drives the liquid crystal layer 175 such that the liquid crystal of the liquid crystal layer 175 tilts in the form of a lens according to a voltage provided by the second driver 135. To achieve this, the second panel 170 comprises a second lower substrate and a second upper substrate opposite to each other having the liquid crystal layer 175 tilting in the form of a lens, formed between them. Although an upper electrode and a lower electrode for driving the liquid crystal layer 175 such that the liquid crystal of the liquid crystal layer 175 tilts in the form of a lens may be respectively formed on the second lower substrate and the second upper substrate, the electrode structure is not limited thereto. Although the second panel 170 comprises the liquid crystal layer 175 tilting in the form of a lens according to the voltage supplied from the second driver 135 in this document, the second panel 170 may comprise a lenticular lens instead of the liquid crystal layer 175. In this case, the second driver 135 can be omitted.

The operation of the aforementioned autostereoscopic display device will now be roughly explained. The first panel 150 displays an image according to video data supplied from the first driver 130. The second panel 170 drives the liquid crystal layer 175 such that the liquid crystal of the liquid crystal layer 175 tilts in the form of a lens so as to display the image displayed on the first panel 150 as a right-eye image and a left-eye image according to a voltage supplied from the second driver 135. Then, a user can view a 3D image through the second panel 170 without wearing polarization glasses.

Figure 5:
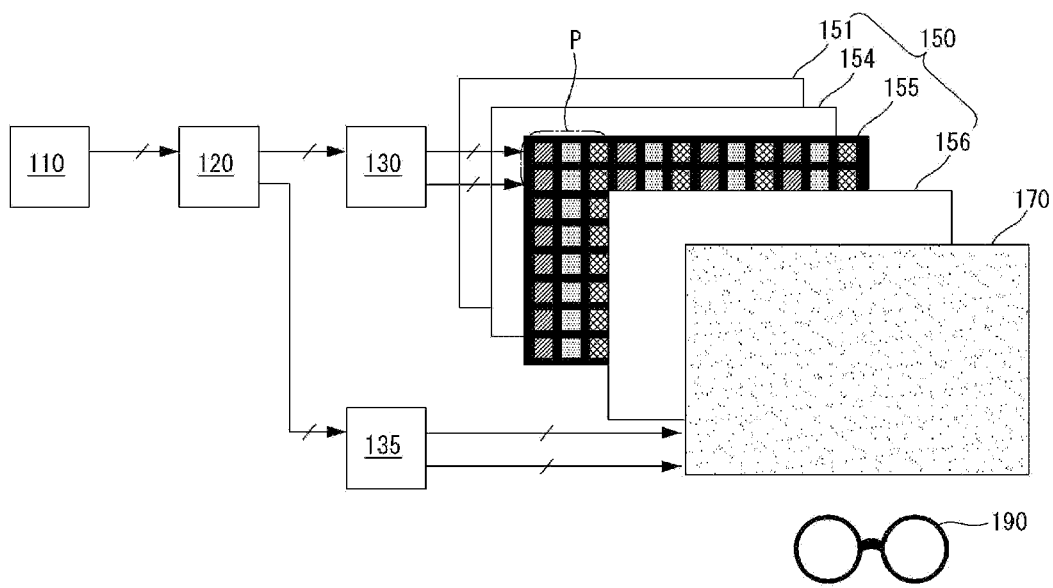
FIG. 5 is a schematic diagram of a stereoscopic display device.

Referring to FIG. 5, a stereoscopic display device comprises the image providing unit 110, the controller 120, the first driver 130, the second driver 135, the first panel 150, the second panel 170, and polarization glasses 190.

The image providing unit 110 provides video data in a 2D format to the controller 120 in a 2D mode and supplies right-eye/left-eye video data in a 3D format to the controller 120 in a 3D mode. The image providing unit 110 provides timing signals including a vertical synchronization signal, a horizontal synchronization signal, a data enable signal, a main clock signal and a low voltage to the controller 120. Furthermore, the image providing unit 110 selects the 2D mode or the 3D mode according to user's selection input through a user interface. The user interface comprises user input units including an OSD, a remote controller, a keyboard, a mouse, and the like. The image providing unit 110 may separate right-eye video data and left-eye video data from each other and encode the right-eye video data and left-eye video data according to right-eye and left-eye images displayed on the first panel 150.

The controller 120 provides right-eye video data and left-eye video data to the first panel 150. The controller 120 provides video data input from the image providing unit 110 to the first driver 130 at a frame frequency of 60×n Hz (n is an integer equal to or greater than 2).

The first driver 130 comprises a data driving circuit connected to data lines and a gate driving circuit connected to gate lines. The data driving circuit converts digital video data input from the controller 120 into positive/negative analog data voltages and provides the positive/negative analog data voltages to the data lines under the control of the controller 120. The gate driving circuit sequentially provides gate pulses (or scan pulses) to the gate lines under the control of the controller 120.

The second driver 135 supplies a voltage to electrodes formed on the second panel 170 such that the polarization property of the second panel 170 is changed along the boundary of the right-eye video data and the left-eye video data in the first panel 150.

The second panel 170 comprises a liquid crystal layer that converts light from the first panel 150 into first polarized light during an Nth frame period according to the voltage provided by the second driver 135 and converts the light from the first panel 150 into second polarized light during an (N+1)th frame period in response to a second driving voltage.

The polarization glasses 190 comprise right-eye and left-eye glasses having different light-absorbing axes to make polarization properties of left and right eyes different from each other. The polarization glasses 190 comprise a polarizer that changes the polarization property according to the structure of the second panel 170. The structure of the polarizer may be changed. Furthermore, the polarization glasses 190 may further comprise a compensation plate.

An operation of the stereoscopic display device will now be explained. The first panel 150 alternately displays a right-eye image and a left-eye image according to video data supplied from the first driver 130. The second panel 170 converts lights of the images displayed on the first panel 150 according to a voltage supplied from the second driver 135. Then, a user can view a 3D image through the second panel 170 by using the polarization glasses 190 including left and right glasses having different light-absorbing axes.

An attaching process of aligning two panels with each other to attach the two panels to each other is required to manufacture display devices for various purposes, as described above. The attaching process may be performed in such a manner that substrates constructing each panel are attached to each other, and then the two panels are attached to each other. A method of reducing the number of alignment keys used for the attaching process and structures of the alignment keys for improving attaching accuracy will now be explained.

Figure 6:
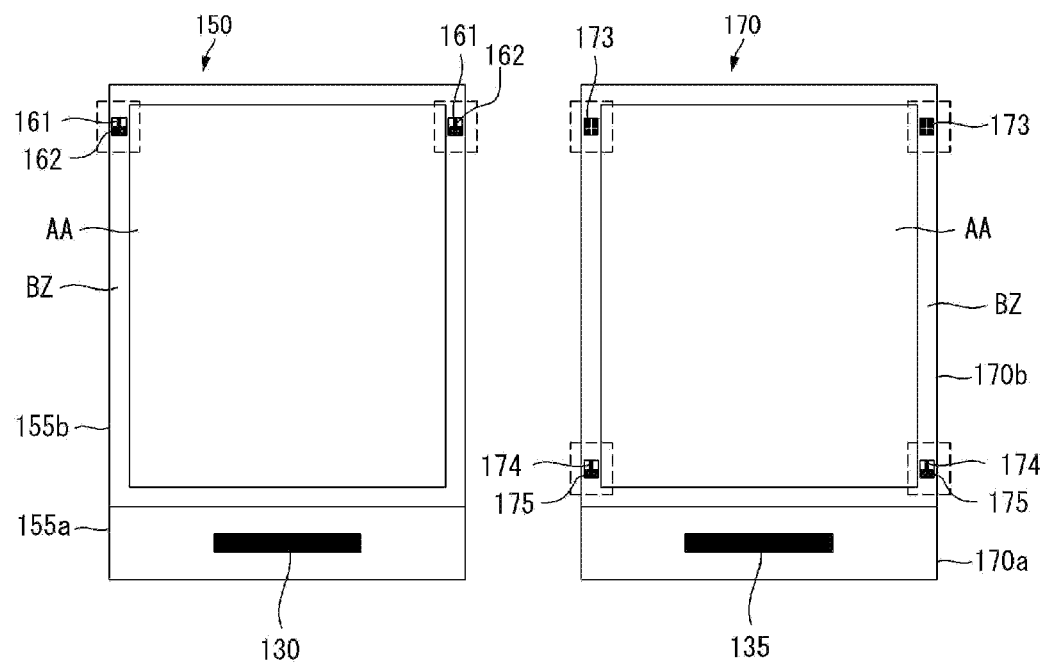
FIGS. 6 and 7 illustrate a first panel and a second panel attached to each other.
Figure 7:
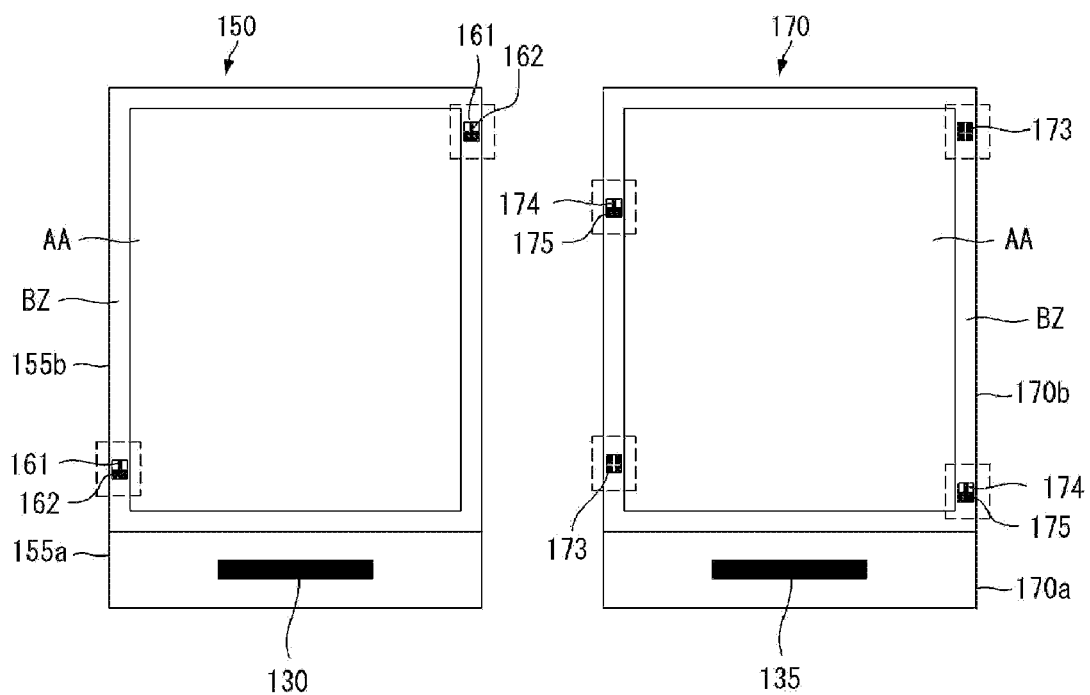
Figure 8:
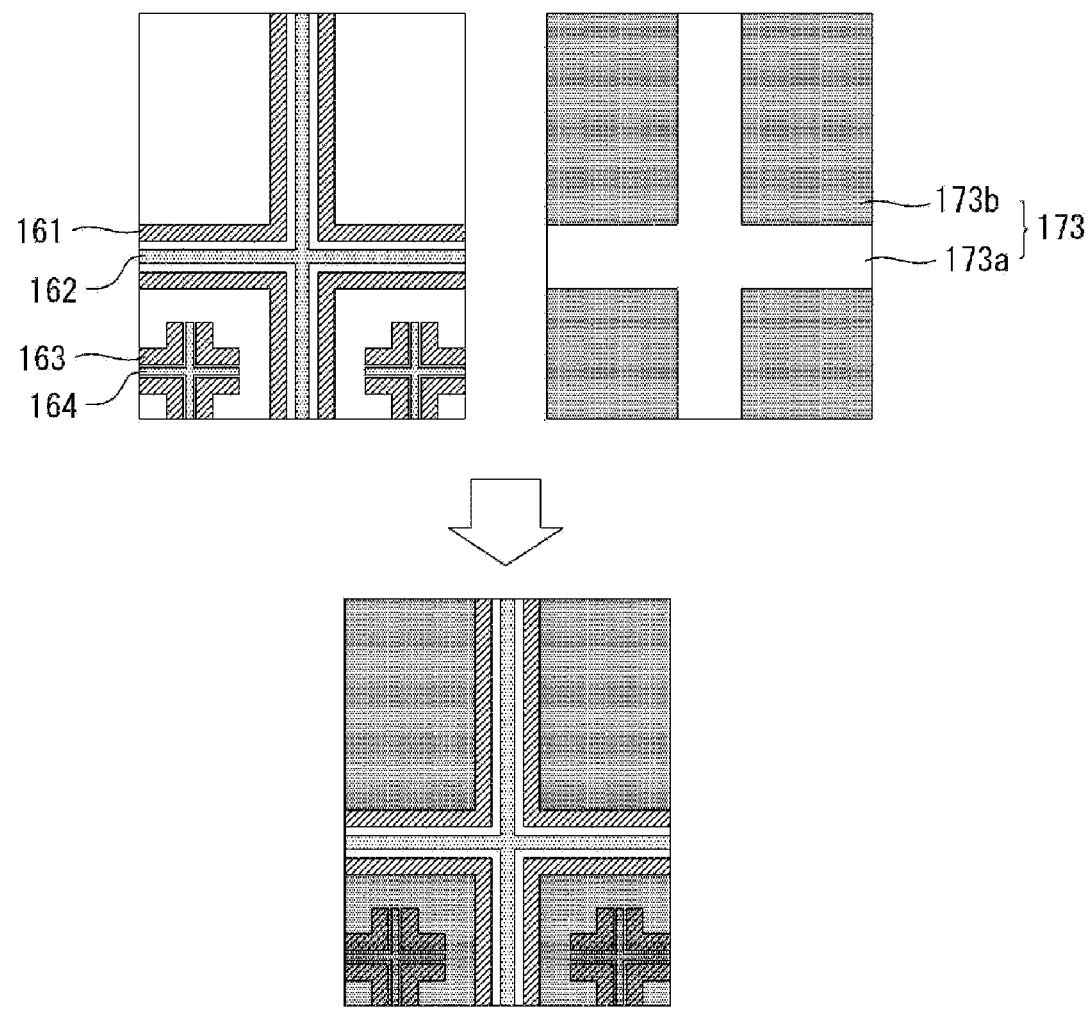
FIG. 8 illustrates alignment keys in detail.

Referring to FIGS. 6, 7 and 8, the first panel 150 comprises a first lower substrate 155a and a first upper substrate 155b attached to the first lower substrate 155a. The first lower substrate 155a and the first upper substrate 155b are aligned with each other by a first alignment key 161 and a second alignment key 162 respectively formed in positions corresponding to each other on the first lower substrate 155a and the first upper substrate 155b and attached to each other. The second panel 170 comprises a second lower substrate 170a and a second upper substrate 170b attached to the second lower substrate 170a. The second panel 180 comprises a third alignment key 173 formed in a position corresponding to the first and second alignment keys 161 and 162. The third alignment key 173 may be formed on the second lower substrate 170a or the second upper substrate 170b of the second panel 170. Although the first driver 130 and the second driver 135 are respectively formed on the first lower substrate 155a of the first panel 150 and the second lower substrate 170a of the second panel 170 in FIGS. 6 and 7, the positions of the first and second drivers 130 and 135 are not limited thereto.

The first panel 150 and the second panel 170 are aligned with each other according to the third alignment key 173 formed such that the first and second alignment keys 161 and 162 are identified and attached to each other during an attaching process.

The first, second and third alignment keys 161, 162 and 173 may be formed in a bezel region BZ located around a display area AA defined in the first and second panels 150 and 170. A pair of alignment keys 161, a pair of second alignment keys 162 and a pair of third alignment keys 173 are respectively formed at left and right sides of the top of the bezel region BZ in FIG. 6. However, the positions of the first, second and third alignment keys 161, 162 and 173 are not limited thereto and the first, second and third alignment keys 161, 162 and 173 may be formed in pairs in other positions in the bezel region BZ, as shown in FIG. 7.

Referring to FIG. 8, the third alignment key 173 comprise a transparent region 173a through which predetermined portions of the first and second alignment keys 161 and 162 can be identified after the first and second panels 150 and 170 are aligned with each other and an opaque region 173b that covers the remaining portions of the first and second alignment keys 161 and 162. The transparent region 173a of the third alignment key 173 may be formed such that the edges of the first and second alignment keys 161 and 162 can be identified through the transparent region 173a. FIG. 8 illustrates that the third alignment key 173 comprises the transparent region 173 through which the edge of the first alignment key 161 is identified. Furthermore, FIG. 8 illustrates the first, second and third alignment keys 161, 162 and 173 have a cross shape. However, the first, second and third alignment keys 161, 162 and 173 have various shapes comprising a triangle, a square and a circle.

The first and second alignment keys 161 and 162 respectively comprise first and second sub-alignment keys 163 and 164 corresponding to the opaque region 173b of the third alignment key 173, which are not identified. The first and second sub-alignment keys 163 and 164 are respectively formed in positions corresponding to each other on the first lower substrate 155a and the first upper substrate 155b of the first panel 150. The first and second sub-alignment keys 163 and 164 may be smaller than the first and second alignment keys 161 and 162. While the first and second sub-alignment keys 163 and 164 are formed around the first and second alignment keys 161 and 162 in FIG. 8, the positions of the first and second sub-alignment keys 163 and 164 are not limited thereto.

The second panel 170 comprises a fourth alignment key 174 and a fifth alignment key 175 used to attach the second lower substrate 170a and the second upper substrate 170b to each other. The fourth and fifth alignment keys 174 and 175 may be formed in positions corresponding to each other on the second lower substrate 170a and the second upper substrate 170b. The fourth and fifth alignment keys 174 and 175 may be formed in the bezel region BZ around the display area AA defined in the first panel 150 and the second panel 170 such that the fourth and fifth alignment keys 174 and 175 are distinguished from the first, second and third alignment keys 161, 162 and 173. The second lower substrate 170a and the second upper substrate 170b are aligned with each other according to the fourth and fifth alignment keys 174 and 175 and attach to each other through an attaching process.

When the first, second and third alignment keys 161, 162 and 173 are formed on the first and second panels 150 and 170 as described above, the first and second panels 150 and 170 can be aligned with each other through a combination of the first and second alignment keys 161 and 162, which are used to attach the first lower substrate 155a and the first upper substrate 155b of the first panel 150 to each other, and the third alignment key 173, and thus the number of alignment keys used for the attaching process can be decreased.

As described above, the structures of the alignment keys used to attach substrates to each other and attach panels to each other can be changed to reduce the number of alignment keys used for the attaching processes and improve attaching accuracy.

The foregoing embodiments and advantages are merely exemplary and are not to be construed as limiting the present invention. The present teaching can be readily applied to other types of apparatuses. The description of the foregoing embodiments is intended to be illustrative, and not to limit the scope of the claims. Many alternatives, modifications, and variations will be apparent to those skilled in the art.

What is claimed is:

1. A display device comprising:
   a first panel comprising a first lower substrate and a first upper substrate;

a first alignment key formed in the first lower substrate;

a second alignment key formed in the first upper substrate, the second alignment key is disposed in a position corresponding to the first alignment key;

a second panel attached to the first panel; and a third alignment key formed in the second panel, the third alignment key is disposed in a position corresponding to the first and the second alignment keys and formed such that the first and the second alignment keys are identified.

2. The display device of claim 1, wherein the first, second and third alignment keys have a cross shape.

3. The display device of claim 1, wherein the first, second and third alignment keys are formed in a bezel region located around a display.

4. The display device of claim 1, wherein the third alignment key comprises a transparent region through which predetermined portions of the first and second alignment keys are identified and an opaque region through which the remaining portions of the first and second alignment keys are not identified.

5. The display device of claim 4, wherein the transparent region of the third alignment key is formed such that the edge of the first or second alignment key is identified.

6. The display device of claim 1, wherein the first alignment key and the second alignment key respectively comprise a first sub-alignment key and a second sub-alignment key which are disposed in regions that are not identified by the third alignment key, and the first sub-alignment key and the second sub-alignment key are formed at positions corresponding to each other and located around the first alignment key and the second alignment key.

7. The display device of claim 6, wherein size of the first and second sub-alignment keys are smaller than size of the first and second alignment keys.

8. The display device of claim 1, wherein the second panel comprises a second lower substrate having a fourth alignment key and a second upper substrate having a fifth alignment key disposed in a position corresponding to the fourth alignment key, the second lower substrate and the second upper substrate are aligned with each other by the fourth alignment key and the fifth alignment key.

9. The display device of claim 8, wherein the fourth and fifth alignment keys are formed in the bezel region located around the display area defined in the first and second panels such that the fourth and fifth alignment keys are distinguished from the first, second and third alignment keys.

10. The display device of claim 1, wherein the second panel is a control panel that controls an image displayed on the first panel and displays the controlled image.

11. A method of manufacturing a display device, comprising:

forming a first alignment key formed in the first lower substrate;

forming a second alignment key formed in the first upper substrate, which is disposed in a position corresponding to the first alignment key;

aligning the first lower substrate and the first upper substrate using the first alignment key and the second alignment key;

attaching the first lower substrate and the first upper substrate to form a first panel;

forming a second panel;

forming a third alignment key formed in the second panel, which is disposed in a position corresponding to the first and the second alignment keys and formed such that the first and the second alignment keys are identified;

aligning the first panel and the second panel using the first, the second and the third alignment key; and attaching the first panel and the second.

12. The method of claim 11, wherein the first, second and third alignment keys have a cross shape.

13. The method of claim 11, wherein the first, second and third alignment keys are formed in a bezel region located around a display.

14. The method of claim 11, wherein the third alignment key comprises a transparent region through which predetermined portions of the first and second alignment keys are identified and an opaque region through which the remaining portions of the first and second alignment keys are not identified.

15. The method of claim 14, wherein the transparent region of the third alignment key is formed such that the edge of the first or second alignment key is identified.

16. The method of claim 11, wherein the first alignment key and the second alignment key respectively comprise a first sub-alignment key and a second sub-alignment key which are disposed in regions that are not identified by the third alignment key, and the first sub-alignment key and the second sub-alignment key are formed at positions corresponding to each other and located around the first alignment key and the second alignment key.

17. The method of claim 16, wherein size of the first and second sub-alignment keys are smaller than size of the first and second alignment keys.

18. The method of claim 11, wherein the second panel comprises a second lower substrate having a fourth alignment key and a second upper substrate having a fifth alignment key disposed in a position corresponding to the fourth alignment key, the second lower substrate and the second upper substrate are aligned with each other by the fourth alignment key and the fifth alignment key.

19. The method of claim 18, wherein the fourth and fifth alignment keys are formed in the bezel region located around the display area defined in the first and second panels such that the fourth and fifth alignment keys are distinguished from the first, second and third alignment keys.

20. The method of claim 11, wherein the second panel is a control panel that controls an image displayed on the first panel and displays the controlled image.

* * * * *